(12) United States Patent
Nishiyama

(10) Patent No.: US 8,582,315 B2
(45) Date of Patent: Nov. 12, 2013

(54) ELECTRONIC APPARATUS AND METHOD RELATED THERETO

(75) Inventor: Takeshi Nishiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 178 days.

(21) Appl. No.: 13/010,340

(22) Filed: Jan. 20, 2011

(65) Prior Publication Data

US 2012/0020038 A1      Jan. 26, 2012

(30) Foreign Application Priority Data

Jan. 29, 2010   (JP) .................................. 2010-19758

(51) Int. Cl.
*H05K 7/02*          (2006.01)
*H05K 7/04*          (2006.01)

(52) U.S. Cl.
USPC .......................................... 361/807; 361/810

(58) Field of Classification Search
USPC ............ 361/807, 809, 810, 792, 679.01, 742, 361/736; 211/41.17; 345/156, 204
See application file for complete search history.

(56) References Cited

U.S. PATENT DOCUMENTS

| | | | |
|---|---|---|---|
| 4,226,491 A * | 10/1980 | Kazama et al. ............... | 439/76.1 |
| 4,993,965 A | 2/1991 | Eck | |
| 5,268,820 A | 12/1993 | Tseng et al. | |
| 5,281,149 A * | 1/1994 | Petri ............................... | 439/66 |
| 5,446,622 A * | 8/1995 | Landry et al. .................. | 361/737 |
| 6,234,820 B1 * | 5/2001 | Perino et al. ................... | 439/326 |
| 6,960,094 B2 | 11/2005 | Tomonari et al. | |
| 7,004,764 B2 * | 2/2006 | Boudreau et al. ............... | 439/74 |
| 7,466,563 B2 * | 12/2008 | Hsu ................................. | 361/810 |
| 2006/0189196 A1 | 8/2006 | Kameda | |

FOREIGN PATENT DOCUMENTS

| | | |
|---|---|---|
| GB | 1369995 | 10/1974 |
| GB | 2188669 A | 10/1987 |
| GB | 2403602 A | 1/2005 |
| JP | 10-294576 | 11/1998 |
| JP | 2004-327646 | 11/2004 |
| JP | 2007-234736 | 9/2007 |
| JP | 2008-282722 | 11/2008 |
| WO | 2004/062328 A1 | 7/2004 |

OTHER PUBLICATIONS

Korean Office Action mailed Jun. 1, 2012 issued in corresponding Korean Patent Application No. 10-2011-0003811.
European Search Report dated May 4, 2011 issued in corresponding European Patent Application No. 11152029.2.
Japanese Office Action issued Jul. 16, 2013 in corresponding Japanese Application No. 2010-019758.

* cited by examiner

*Primary Examiner* — Hung S Bui
(74) *Attorney, Agent, or Firm* — Staas & Halsey LLP

(57) ABSTRACT

An electronic apparatus includes a first printed circuit board on which a first connector is provided, a first member connected with the first printed circuit board and having a first hole, a second member connected with the first printed circuit board and including a projecting portion extending in a standing direction on the first printed circuit board, and a second printed circuit board that includes a second connector connected to the first connector, a first end portion that penetrates the first hole, and a second end portion having a second hole, where the projecting portion of the second member penetrates the second hole.

13 Claims, 18 Drawing Sheets

ELECTRONIC APPARATUS AND METHOD RELATED THERETO

CROSS-REFERENCE TO RELATED APPLICATIONS

This application is based upon and claims priority to prior Japanese Patent Application No. 2010-19758 filed on Jan. 29, 2010 in the Japan Patent Office, the entire contents of which are incorporated herein by reference.

FIELD

Various embodiments of the present invention discussed herein relate to an electronic apparatus and operation(s) relating thereto.

BACKGROUND

In recent years, various techniques relating to the layout and shape of a connector that connects printed circuit boards (PCB) have been developed in order to realize a smaller size and a higher packaging density of an electronic apparatus such as an information processing apparatus. For example, there is a technique using a stack connector to electrically connect a motherboard and a module PCB in the electronic apparatus.

A stack connector is provided on a module PCB in a manner such as to be flush with an electronic component to be mounted. Therefore, when the module PCB is connected to a motherboard with the stack connector, an electronic component on the motherboard opposes the electronic component on the module PCB. For this reason, all electronic components are located between the module PCB and the motherboard, and this increases packaging density.

However, when the stack connector is used, it is difficult to properly connect the module PCB to the motherboard because the stack connector is hidden from view by the module PCB. If the module PCB is improperly connected including due to lack of checking the position of the connector, the electronic components sometimes interfere with other components or members and break the components or members.

The disclosed technique has been made in view of the above and other circumstances, and an object of the disclosed technique is to provide an electronic apparatus in which a module PCB can be easily and reliably connected using a stack connector.

According to an embodiment of an electronic apparatus disclosed in this application, it is possible to easily and reliably connect a module PCB using a stack connector.

For example, Japanese Laid-open Patent Publication No. 2004-327646 discusses a connecting member and a connecting method therefor.

SUMMARY

According to an aspect of the invention, an electronic apparatus includes a first printed circuit board on which a first connector is provided, a first member connected with the first printed circuit board and having a first hole, a second member connected the first printed circuit board and having a projecting portion extending in a standing direction on the first printed circuit board, and a second printed circuit board that includes a second connector connected to the first connector, a first end portion that penetrates the first hole, and a second end portion having a second hole is opened, where the projecting portion of the second member penetrates the second hole.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

Figure 1:
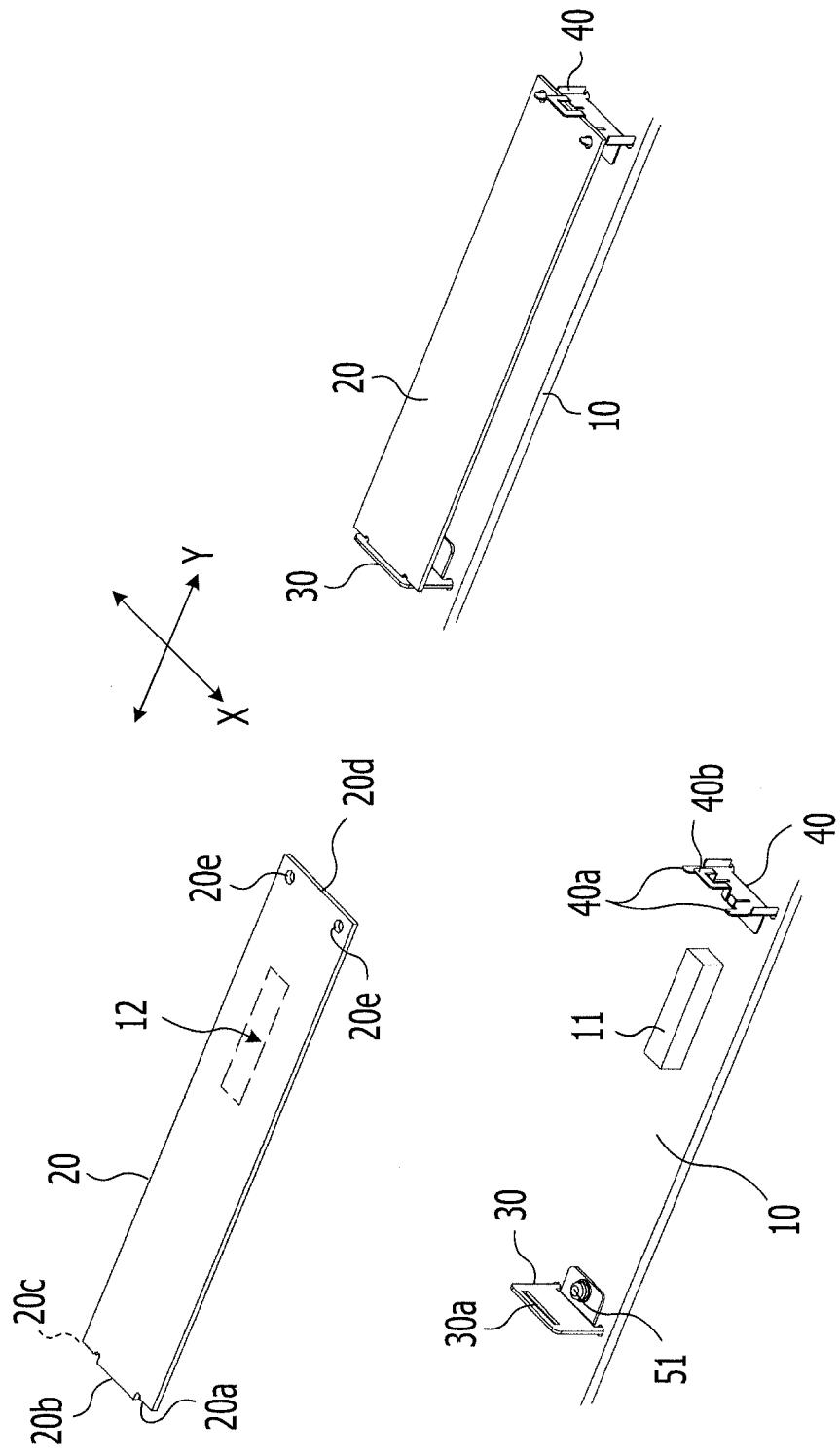
FIG. 1 illustrates addition of a module in an electronic apparatus according to an embodiment.

Reference will now be made in detail to the embodiments, examples of which are illustrated in the accompanying drawings, wherein like reference numerals refer to the like elements throughout. The embodiments are described below to explain the present invention by referring to the figures.

An electronic apparatus according to an embodiment disclosed in this application will be described in detail below with reference to the drawings. This embodiment is not intended to limit the disclosed technique.

FIG. 1 illustrates addition of a module to the electronic apparatus of an embodiment. As illustrated in FIG. 1, a motherboard 10 of the electronic apparatus serves as a first printed circuit board (PCB) including a connector 11 serving as a first connector, a component 30 serving as a first component, and a component 40 serving as a second component. The component 30 may be a sheet metal member that stands to be flush with the connector 11. The component 30 has an opening portion 30a serving as a first hole, and the component 30 is secured to the motherboard 10 with a screw 51.

The component 40 maybe a sheet metal member that stands on the motherboard 10 to be flush with the connector 11. The component 40 has projecting portions 40a that stand on a surface of the motherboard 10 where the connector 11 is provided. The component 40 also has a lock portion 40b serving as a latching portion that latches one end of a module 20 together.

The module 20 is a second PCB having a surface on which an electronic component (not illustrated) and a second connector 12 are both mounted. The module 20 is attached to the motherboard 10 in a manner such that the surface thereof with the electronic component and the connector 12 opposes the surface of the motherboard 10 with the connector 11. By engaging the connector 11 and the connector 12 together, the motherboard 10 is electrically connected to the module 20.

The PCB of the module 20 has a projecting edge portion 20b and a base end portion 20c on an end face 20a serving as a first end portion. When mounting the module 20 on the motherboard 10, the projecting edge portion 20b is fitted in the opening portion 30a of the component 30. Further, the PCB of the module 20 has opening portions 20e serving as second holes at an end face 20d serving as a second end portion. When mounting the module 20 on the motherboard 10, the projecting portions 40a of the component 40 are fitted in the opening portions 20e.

A detailed description of an operation of attaching and mounting the module 20 on the motherboard 10 is provided below. In the following description, a direction extending from the end face 20a to the end face 20d of the module 20 is designated as the Y-direction, and a direction perpendicular to the Y-direction and parallel to the motherboard 10 is designated as the X-direction.

Figure 2:
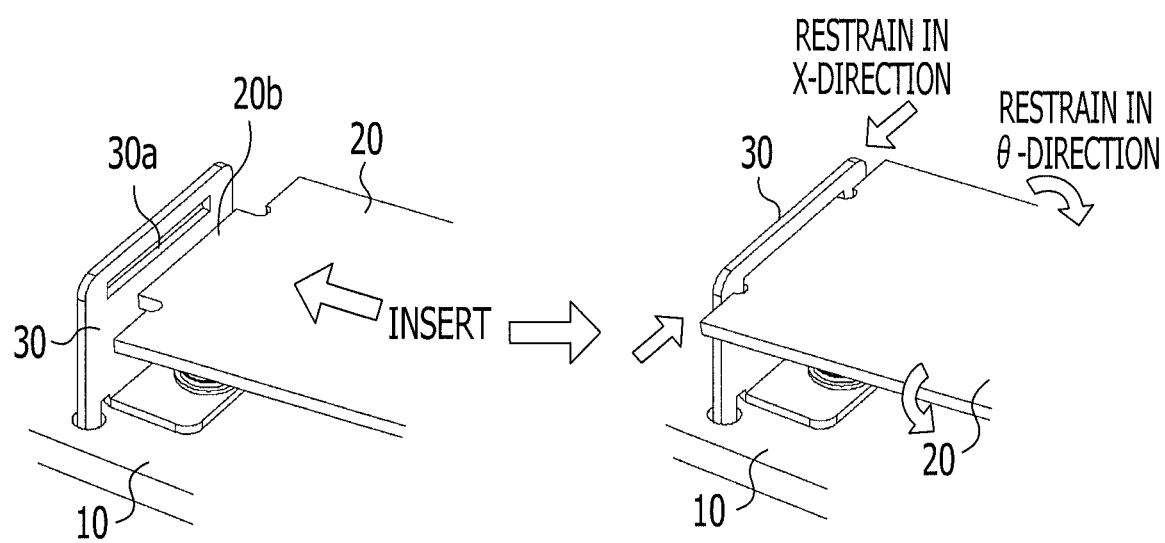
FIG. 2 is a first explanatory view illustrating an operation of mounting a module.
Figure 3:
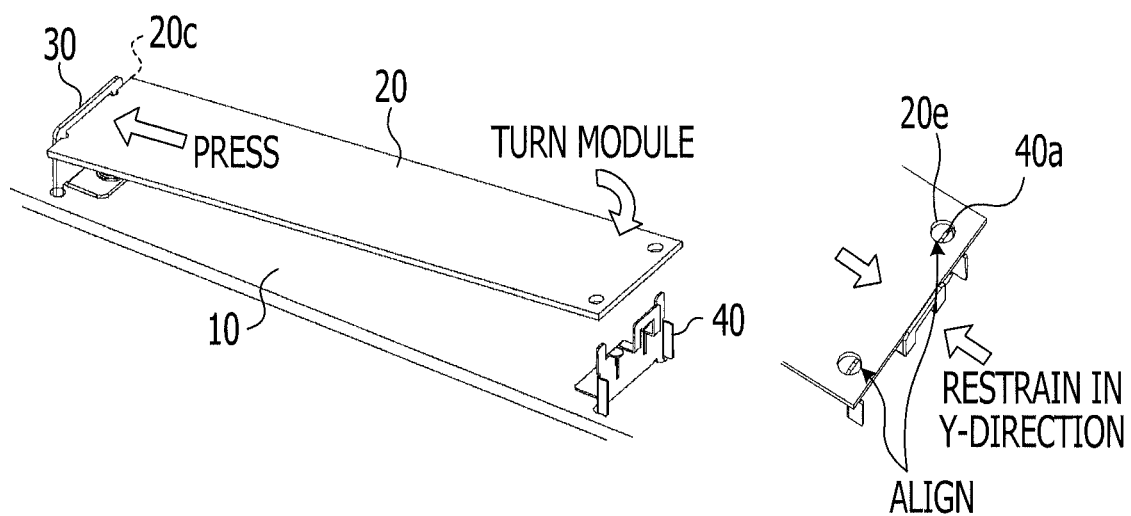
FIG. 3 is a second explanatory view illustrating the operation of mounting the module.

FIGS. 2 and 3 illustrate an operation of mounting the module 20. To attach the module 20 to the motherboard 10, first, the projecting edge portion 20b of the module 20 is inserted in the opening portion 30a of the component 30, as illustrated in FIG. 2. This insertion restrains the module 20 in the X-direction, and also restrains the module 20 from turning in a O-direction perpendicular to the Y-axis on the X-Y plane.

As illustrated in FIG. 3, the module 20 is turned on the base end portion 20c in a direction to move the end face 20d closer to the component 40 while pressing the base end portion 20c against the component 30 in a state in which the projecting edge portion 20b is fitted in the opening portion 30a, whereby the opening portions 20e are aligned with the projecting portions 40a.

By thus turning the module 20 in pressing contact with the component 30, the projecting portions 40a of the component 40 can be easily aligned with the opening portions 20e of the module 20. The alignment between the projecting portions 40a and the opening portions 20e restrains the module 20 in the Y-direction, so that positioning of the connectors 11 and 12 is completed.

Figure 4:
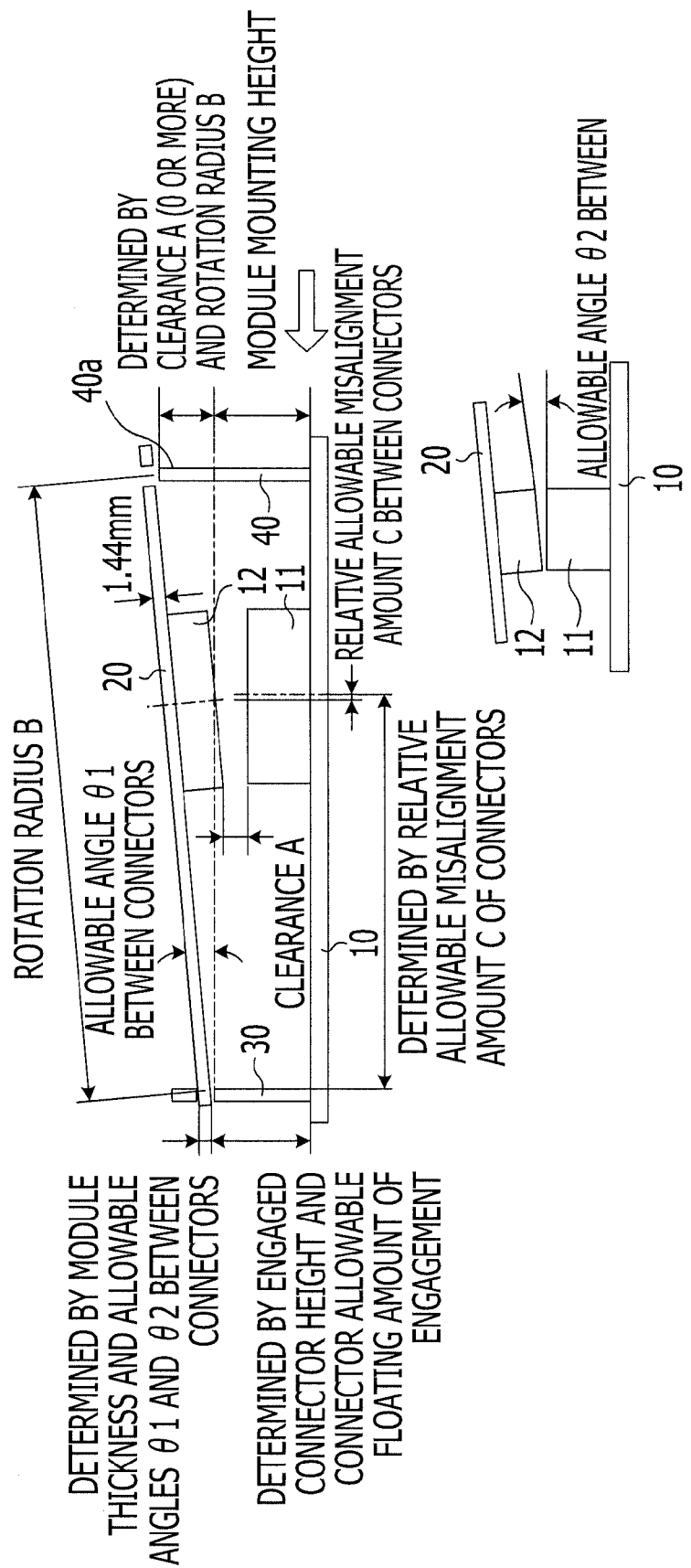
FIG. 4 illustrates exemplary size relations among connectors and components.

FIG. 4 illustrates size relations among the connectors 11 and 12 and the components 30 and 40. A lower end of the opening portion 30a of the component 30 is determined by the height of the engaged connectors 11 and 12 and the allowable floating amount of engagement of the connectors 11 and 12. The height of the engaged connectors 11 and 12 refers to the height of the connector 11 in the state in which the connector 11 and the connector 12 are engaged with each other. For the connector 11 and the second connector 12, the range in which electrical connection therebetween can be ensured even when the engagement is insufficient, that is, the connector 11 floats from the second connector 12 is set. This floating range provided when the connector 11 and the second connector 12 are engaged serves as the floating amount of engagement.

The height of the opening portion 30a, that is, the distance from the lower end to the upper end of the opening portion 30a is determined by the board thickness of the module 20 and allowable angles θ1 and θ2 between the connector 11 and the connector 12. For example, the board thickness of the module 20 is 1.44 mm. The angle θ1 represents the allowable angle between the connectors 11 and 12 in the direction of turn on the X-axis, and the angle θ2 represents the allowable angle between the connectors 11 and 12 in the direction of turn on the Y-axis.

The distance from the component 30 to the connector 11 is determined by a relative allowable misalignment amount C between the connector 11 and the connector 12. Therefore, the distance from the base end portion 20c to the connector 12 is similarly determined by the relative allowable misalignment amount C. The relative allowable misalignment amount C indicates the amount of misalignment in the X-direction and the Y-direction that allows engagement of the connector 11 and the connector 12.

The height from the surface of the motherboard 10 to the lower ends of the projecting portions 40a of the component 40 is determined by the height of the module 20, that is, the height from the surface of the motherboard 10 to the surface of the module 20 in a state in which the module 20 is mounted on the motherboard 10. In order for the connector 11 not to touch the connector 12 in a state in which the surface of the module 20 is in contact with the projecting portions 40a, the height of the projecting portions 40a is set so that a clearance A serving as the shortest distance between the connectors 11 and 12 takes a predetermined value more than or equal to 0. The height of the projecting portions 40a also depends on a rotation radius B of the module 20.

When the size relations among the connectors 11 and 12 and the components 30 and 40 are thus determined, the pressing force of the base end portion 20c against the component 30 becomes weaker, and the projecting portions 40a of the component 40 do not enter the opening portions 20e of the module 20 when the module 20 separates from the surface of the component 30. For this reason, the module 20 cannot further turn in the connector engaging direction. Thus, even when the connector 11 and the connector 12 are misaligned, they do not touch and do not break each other.

Figure 5:
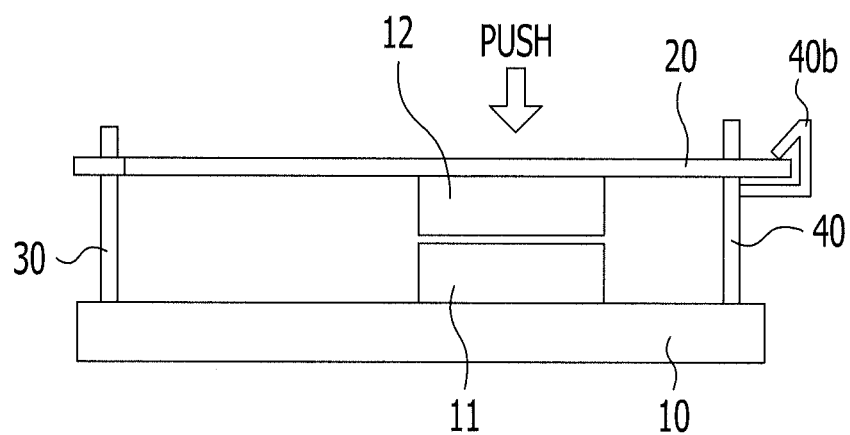
FIG. 5 is a third explanatory view illustrating the operation of mounting the module.

As illustrated in FIG. 5, when the upper surface of the module 20 corresponding to the back side of the connector 12 is pushed in a state in which the projecting portions 40a are fitted in the opening portions 20e and positioning of the connectors 11 and 12 is completed, the connector 11 and the connector 12 engage with each other. Then, the lock portion 40b engages with the end face 20d so as to lock the module 20. A plate connected to the lock portion 40b of the component 40 may be a spring, and is separate from the projecting portions 40a of the component 40. For this reason, even when the lock portion 40b is moved in the unlock direction by being pressed by the PCB of the module 20, the positions of the projecting portions 40a of the component 40 do not change, and the module 20 can be locked and unlocked without any influence on alignment of the connectors 11 and 12.

Figure 6:
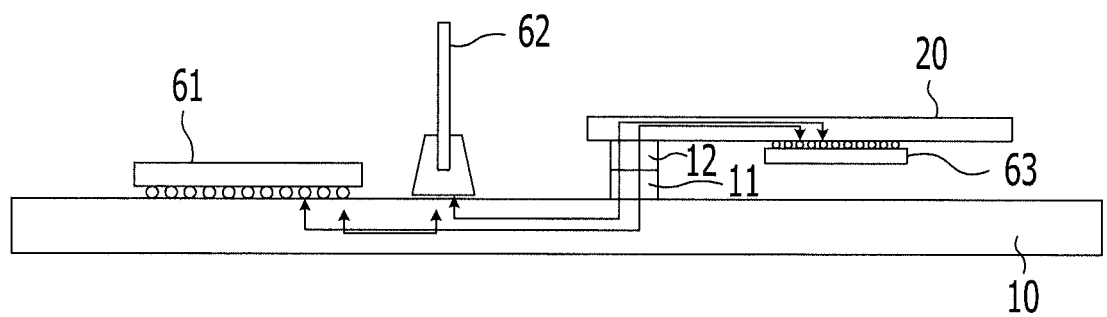
FIG. 6 illustrates a motherboard to which a module is connected.

FIG. 6 illustrates the motherboard 10 to which the module 20 is connected. In the example illustrated in FIG. 6, electronic components, such as a central processing unit (CPU) 61 and a dual inline memory module (DIMM) 62, are mounted on the motherboard 10. The DIMM 62 is electrically connected to the motherboard 10 via a connector. The module 20 electrically connects an electronic component 63 mounted thereon to the electronic components on the motherboard 10 via the connectors 11 and 12 serving as a stack connector.

Thus, by using the stack connector, design can be made while limiting the mounting height of the module removably mounted on the motherboard. The module 20 can have arbitrary functions, for example, functions of a communication circuit, a voltage conversion circuit, and a storage circuit for holding data. When the stack connector is used, the plane including the PCB of the mounted module is parallel to the plane including the motherboard, and the connector provided therebetween is hidden from view by the module PCB. In contrast, the above-described disclosed alignment method allows the module PCB to be mounted easily and reliably.

Figure 7:
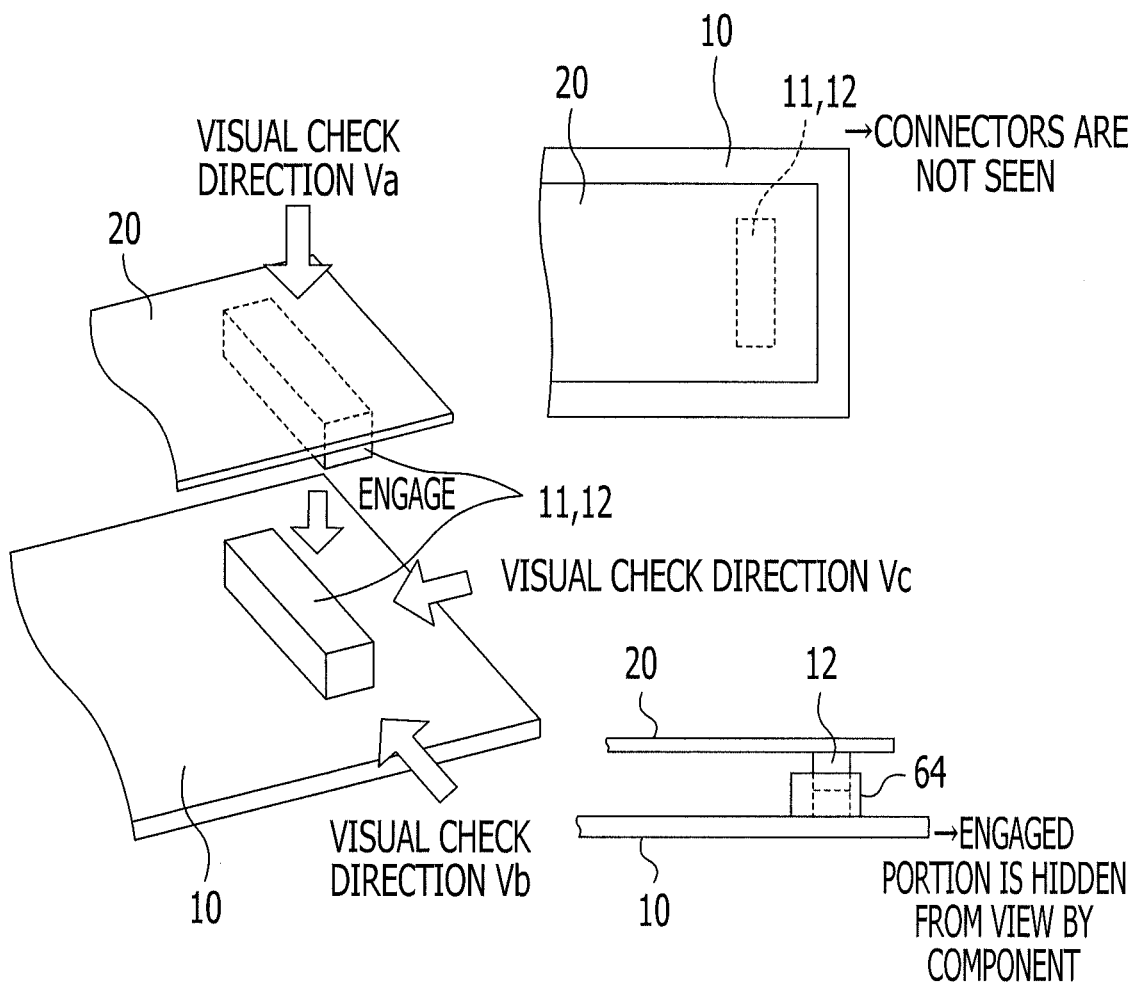
FIG. 7 illustrates a first comparative example of an embodiment.

FIG. 7 illustrates a first comparative example of an embodiment. In the first comparative example, when a module 20 is mounted on a motherboard 10, engagement of connectors 11 and 12 is visually checked, but an alignment mechanism for the connectors is not provided.

In a visual check direction Va of FIG. 7, the connectors 11 and 12 are hidden from view by a PCB of the module 20. Hence, the connectors 11 and 12 are aligned while being watched in two visual check directions Vb and Vc. This makes alignment of the connectors 11 and 12 difficult. Moreover, if a mounted component 64 is mounted near the connectors 11 and 12, checking in the visual check direction Vb cannot be performed, and alignment is performed through trial and error. Therefore, if the module 20 is pushed without noticing misalignment during engagement, it may break the connectors 11 and 12.

Figure 8:
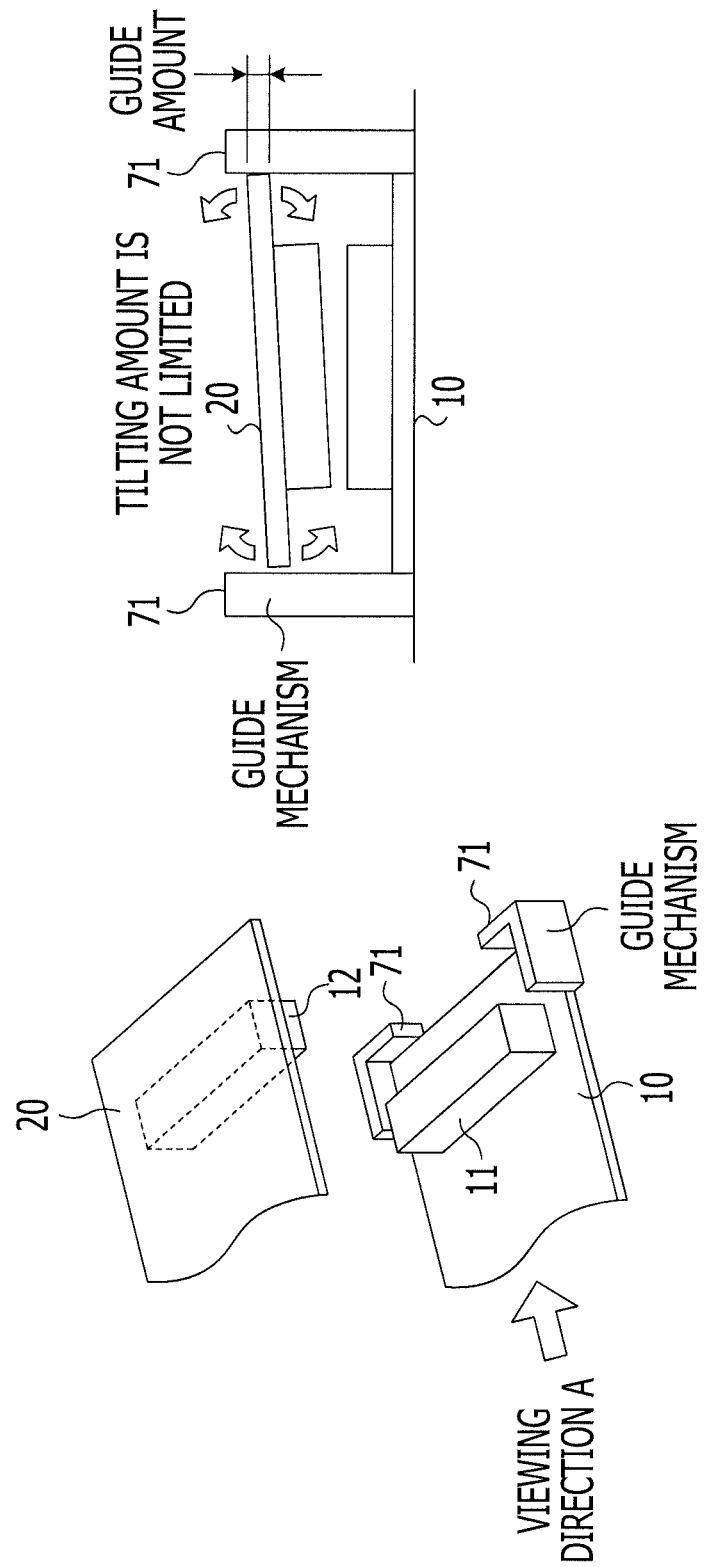
FIG. 8 illustrates a second comparative example of an embodiment.

FIG. 8 illustrates a second comparative example of an embodiment. In the second comparative example, guide mechanisms 71 are provided on a motherboard 10. When connectors 11 and 12 are thus aligned for engagement by the guide mechanisms 71 and the outer shape of a PCB of a module 20, alignment performance of the module 20 is higher than in the first comparative example. However, since the module 20 is guided only by the amount corresponding to the thickness of the PCB thereof, it is apt to tilt during the mounting operation. If the module 20 is pushed in the tilted state, it may break the connectors 11 and 12.

Figure 9:
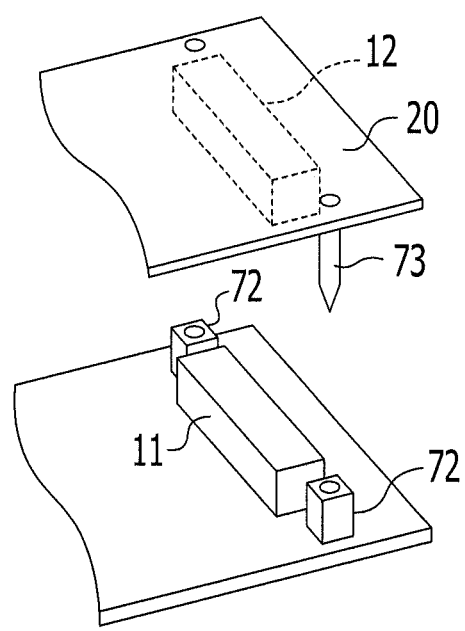
FIG. 9 illustrates a third comparative example of an embodiment.

FIG. 9 illustrates a third comparative example of an embodiment. In the third comparative example, connectors 11 and 12 are aligned for engagement by guide members 72 and guide pins 73 provided on a motherboard 10 and a module 20, respectively. In this case, alignment performance of the module 20 is higher than in the first comparative example, but the guide pins 73 and the guide members 72 are aligned while visually checking in the lateral direction, in a manner similar to that adopted in the first comparative example. If the connectors 11 and 12 are engaged without visual check, the guide pins 73 may break the connector 11 and other components mounted on the motherboard 10.

Figure 10:
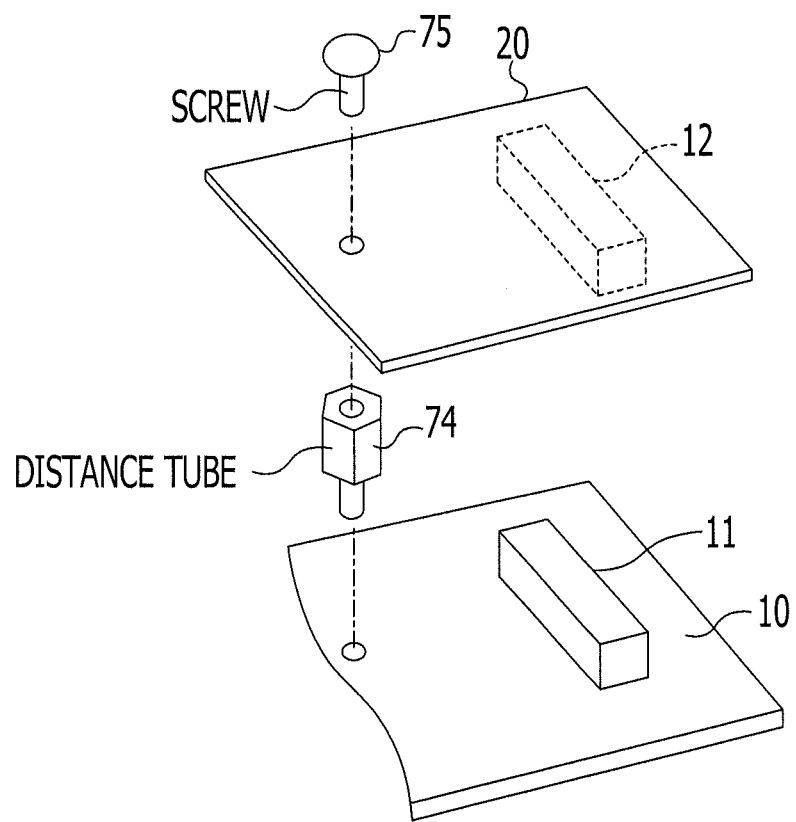
FIG. 10 illustrates a fourth comparative example of an embodiment.

FIG. 10 illustrates a fourth comparative example of an embodiment. In the fourth comparative example, a distance tube 74 is mounted on a motherboard 10 and is secured by a screw 75 from an upper surface of a module 20 in order to prevent the module 20 from falling off because of disturbances such as vibration and shock. The distance tube 74 and the screw 75 are combined as a fall-out prevention member. In the fourth comparative example, the screw 75 needs to be attached and detached with a driver when attaching and detaching the module 20 to/from the motherboard 10, and this takes much time. Particularly when a plurality of modules 20 are provided, the number of man-hours increases. Further, the screw 75 easily drops in handling. If the screw 75 drops onto the motherboard 10 and enters between the mounted components, it is difficult to take out the screw 75, and the mounted components may be damaged and broken. Further, the screw 75 may be dropped on the floor and be lost. In addition, from the structural viewpoint, it is necessary to select a distance tube that matches the height of the engaged connectors 11 and 12 are engaged. If there is no distance tube that matches the height, it is necessary to produce a special distance tube, and this sometimes increases the cost.

When the guide mechanisms for aligning the connectors 11 and 12 and the fall-out prevention member including the distance tube 74 and the screw 75 are mounted on the motherboard and the module, the area on the PCB surface where electronic components can be mounted is reduced by the area of the mounted components, and this decreases packaging density. Further, when penetrating holes are provided in the PCB so as to secure the structural components, wiring density decreases. The decrease in wiring density is more pronounced when the PCB includes a plurality of wiring layers. In addition, when a plurality of modules are mounted on the motherboard, structural components and penetrating holes corresponding to the number of modules are necessary, so that the influence on the motherboard increases.

In contrast to these comparative examples, the structure disclosed in an embodiment allows easy and reliable alignment of the module. Further, since erroneous operation is prevented during alignment, there is no influence on the connectors and the mounted components. Moreover, the module can be easily attached and detached to/from the motherboard, in spite of the presence of the fall-out prevention mechanism for the module. Further, it is possible to flexibly respond to the selected engagement height of the connectors. Moreover, since the occupied area is narrow and the penetrating holes are small in the PCB are small, the influence on the packaging density and wireability on the PCB can be suppressed. The influence on the packaging density and wireability can also be suppressed even when a plurality of modules are mounted.

Figure 11:
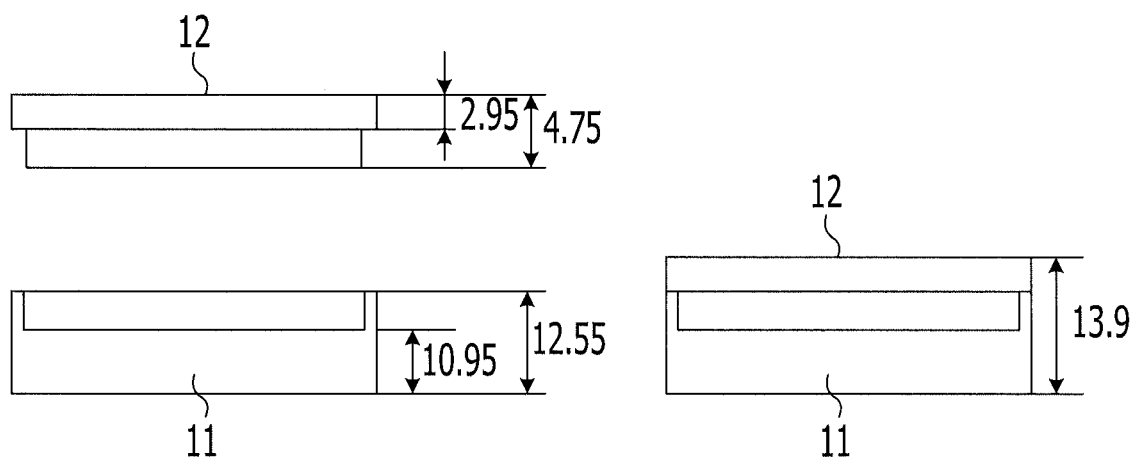
FIG. 11 illustrates concrete exemplary shapes of connectors.

Next, concrete exemplary shapes of the connectors 11 and 12 and the components 30 and 40 will be described. FIG. 11 illustrates concrete exemplary shapes of the connectors 11 and 12. The connector 11 is a female connector having an outer wall with a height of 12.55 mm and an inner surface with a height of 10.95 mm. The connector 12 is a male connector. The entire height of the connector 12 including a projecting portion is 4.75 mm, and the height of a portion of the connector 12 other than the projecting portion is 2.95 mm. When the connectors 11 and 12 are engaged, the height of the engaged connectors 11 and 12 is 13.90 mm.

Figure 12:
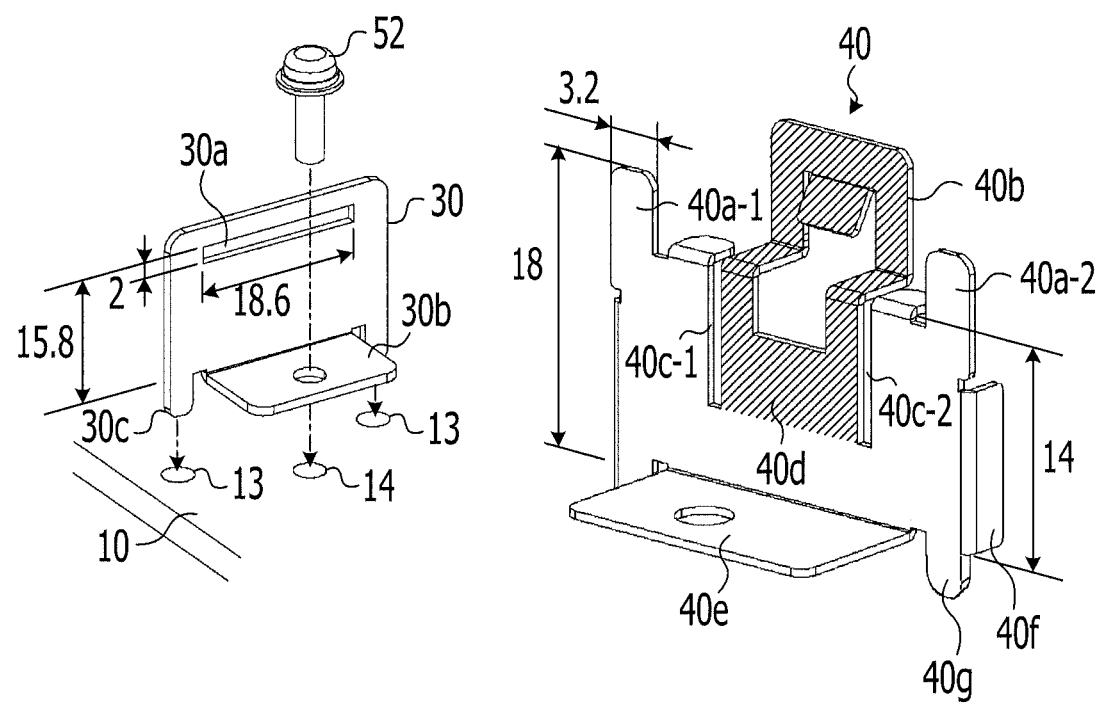
FIG. 12 illustrates concrete exemplary shapes of components.

FIG. 12 illustrates concrete exemplary shapes of the components 30 and 40. The component 30 includes not only the opening portion 30*a*, but also a bent portion 30*b* for securing to the motherboard 10, and lead portions 30*c* serving as first and second leg portions for positioning on the motherboard 10. As described above, the opening portion 30*a* serves to position the module 20 and to prevent the module 20 from falling out.

The width of the opening portion 30*a* is determined by the clearance with respect to the width of the projecting edge portion 20*b* of the module 20, and specifies the degree of restraint of the module 20 in the X-direction. The width of the opening portion 30*a* can be adjusted in consideration of the production tolerance and required accuracy, and is 18.86 mm as an example.

The degree of restriction of turn of the module 20 is determined by the height of the opening portion 30*a* and the clearance with respect to the thickness of the module 20, and is adjusted in consideration of insertability of the projecting edge portion 20*b* and the production tolerance and required accuracy. For example, the height of the opening portion 30*a* is 2.00 mm. By setting the dimension to the upper end of the opening portion 30a in correspondence with the height of the engaged connectors 11 and 12, the connectors 11 and 12 are prevented from disengagement. For example, the dimension to the upper end of the opening portion 30a is 15.80 mm.

The PCB of the motherboard 10 has lead holes 13 serving as first and second positioning holes in which the lead portions 30c of the component 30 are fitted, and a screw hole 14. By fitting the lead portions 30c of the component 30 in the lead holes 13, the component 30 is positioned relative to the motherboard 10. After positioning, the component 30 is secured to the motherboard 10 by being fastened by a screw 52 via an aperture provided in the bent portion 30b.

As described above, the component 40 has the projecting portions 40a and the lock portion 40b. Between the projecting portions 40a and the lock portion 40b, grooves 40c extend in the standing direction on the motherboard 10. A plate connected to the lock portion 40b is a spring portion 40d serving as an elastic portion, and is separated from the projecting portions 40a of the component 40 by the grooves 40c. For this reason, even if the lock portion 40b is moved in the unlock direction by being pressed by the PCB of the module 20, the positions of the projecting portions 40a of the component 40 do not change.

More specifically, the component 40 includes a first grooved portion 40c_1 and a second grooved portion 40c_2 extending from a first side where the projecting portions 40a are provided. A portion between the first grooved portion 40c_1 and the second grooved portion 40c_2 serves as the spring portion 40d for pressing the end face 20d. The lock portion 40b is provided in the spring portion 40d.

The projecting portions 40a include a projecting portion 40a_1 and a projecting portion 40a_2. The projecting portion 40a_1 is provided in a first section defined by the first side, the first grooved portion 40c_1, and a second side opposing the first grooved portion 40c_1. The projecting portion 40a_2 is provided in a second section defined by the first side, the second grooved portion 40c_2, and a third side opposing the second grooved portion 40c_2.

The component 40 also includes a bent portion 40e for securing to the motherboard 10, and lead portions 40g serving as third and fourth leg portions for positioning on the motherboard 10, similarly to the component 30. The PCB of the motherboard 10 has lead holes (not illustrated) serving as third and fourth positioning holes in which the lead portions 40g of the component 40 are fitted. Positioning and securing of the component 40 with the bent portion 40e and the lead portions 40g are similar to those adopted for the component 30.

Insertability of the projecting portions 40a of the component 40 in the opening portions of the module can be enhanced by chamfering the upper ends of the projecting portions 40a with a radius of curvature R. In addition, the positions of the projecting portions 40a are fixed by forming bent portions 40f near the projecting portions 40a. When the board thickness of the component 40 is determined with an assumption that the spring portion 40d is given elasticity by the grooves 40c, the member for supporting the projecting portions 40a also has elasticity. The bent portions 40f serve to suppress the position change of the projecting portions 40a due to this elasticity.

For example, the height from the surface of the motherboard 10 to the upper ends of the projecting portions 40a is 18.00 mm, the height from the surface of the motherboard 10 to the lower ends of the projecting portions 40a is 14.00 mm, and the width of the projecting portions 40a is 3.20 mm.

Figure 13:
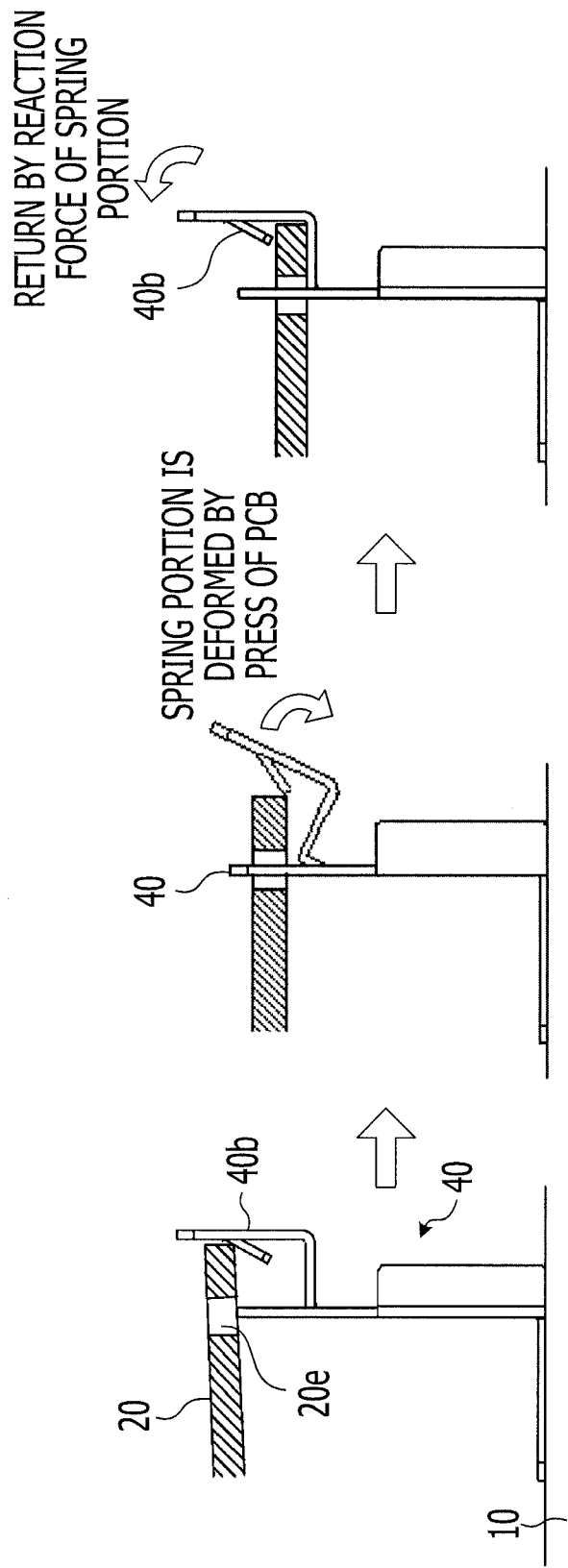
FIG. 13 illustrates a lock operation performed when mounting a module.

FIG. 13 illustrates the lock operation performed during mounting of the module 20. As illustrated in FIG. 13, in a step of inserting the projecting portions 40a in the opening portions 20e of the module 20, the lock portion 40b is pushed by the end face 20d of the module 20, so that the spring portion 40d deforms. After insertion of the projecting portions 40a in the opening portions 20e is completed, the shape of the spring portion 40d returns to its initial shape, and the lock portion 40b latches the end face 20d together.

When the lock mechanism is thus provided, it is possible to inform the user that engagement is completed, and the module 20 is prevented from being pushed excessively. When locking is not performed, trouble of the connectors 11 and 12 can be guessed. This allows reduction of the number of redundant processes and prevention of secondary trouble.

To detach the module 20 from the motherboard 10, the operator operates the lock portion 40b so that the lock portion 40b separates from the end face 20d, whereby the module 20 can be unlocked and taken out.

Figure 14:
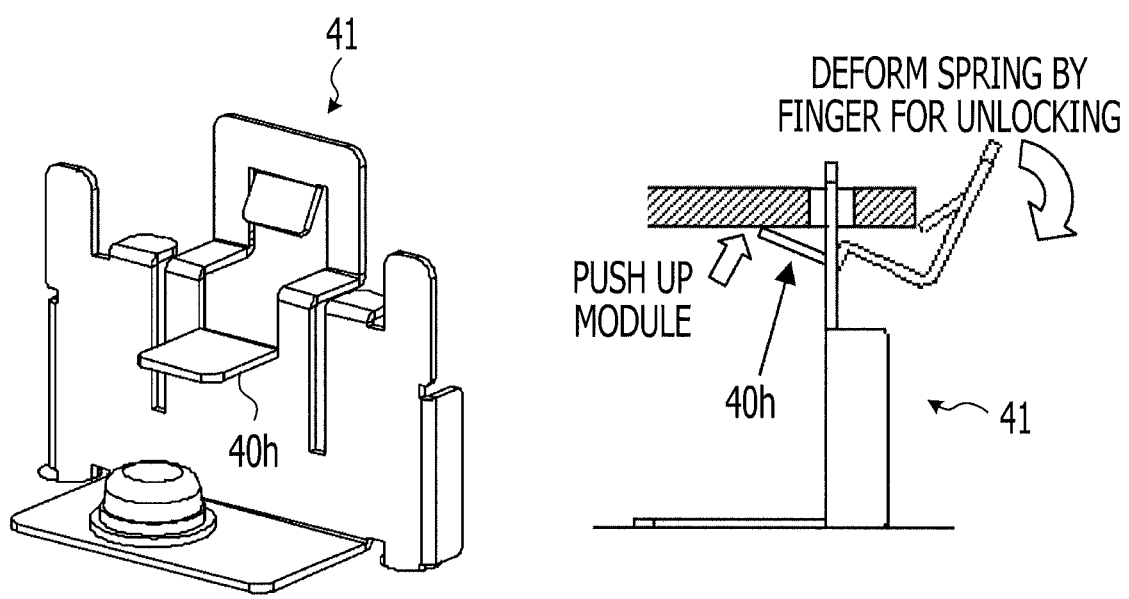
FIG. 14 illustrates a modification including a removal assist mechanism.

FIG. 14 illustrates a modification including a removal assist mechanism. A component 41 illustrated in FIG. 14 is a modification of the component 40, and further includes a bent portion 40h that is operatingly connected to the spring portion 40d. The bent portion 40h is a first support portion located between the motherboard 10 and the module 20 mounted thereon. In conjunction with the unlock operation performed to detach the module 20 from the motherboard 10, the bent portion 40h pushes up the module 20 and supports detachment of the module 20.

Figure 15:
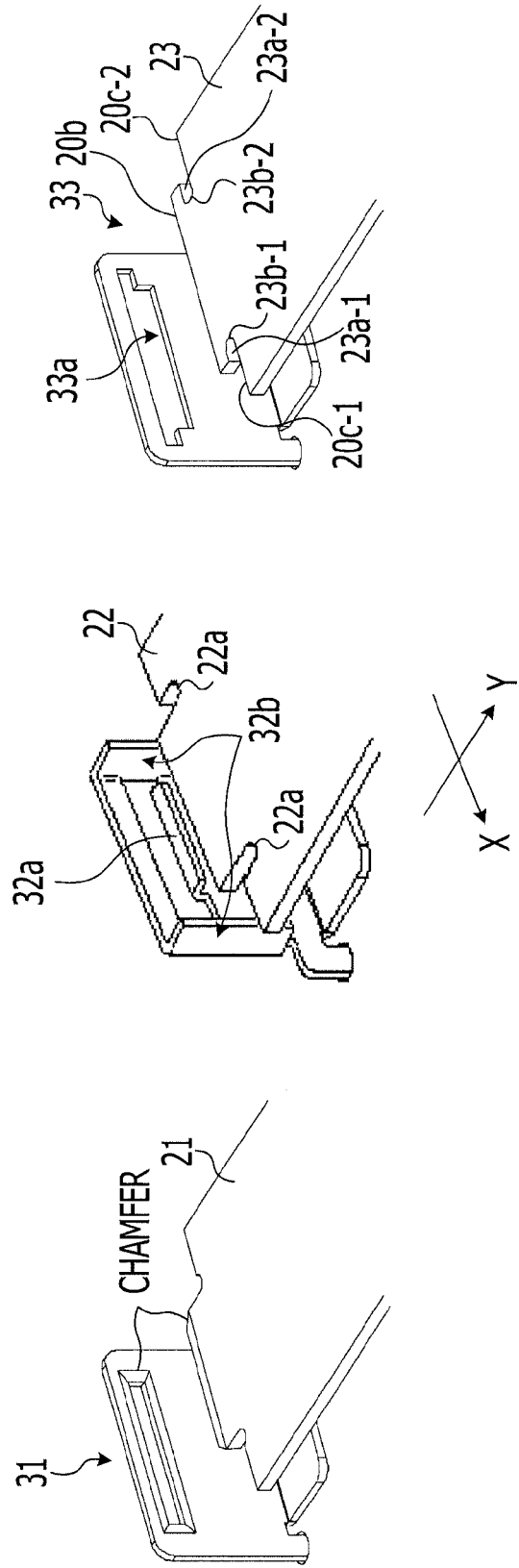
FIG. 15 illustrates modifications of a component and a module.

FIG. 15 illustrates modifications of the component 30 and the module 20. A component 31 illustrated in FIG. 15 is obtained by chamfering an edge of the opening portion of the component 30. Similarly, a module 21 is obtained by chamfering an edge of the projecting edge portion 20b of the module 20. This chamfering enhances insertability of a projecting portion of the module 21 in an opening portion of the component 31.

A component 32 illustrated in FIG. 15 includes a bent portion 32a serving as a second support portion and bent portions 32b serving as first and second bent portions in addition to the structure of the component 30. The bent portion 32a is provided at a lower end of an opening portion, and supports an end of a module 22 by the height of the opening portion, thereby assisting in inserting a projecting portion of the module 22.

The bent portions 32b are provided near the opening portion, and extend toward the module 22. The module 22 has grooved portions 22a provided between the projecting portion and a base end and extending in the Y-direction. When the projecting portion of the module 22 is inserted in the opening portion of the component 32, the bent portions 32b engage with the grooved portions 22a. Thus, the turn of the module 22 in the direction perpendicular to the Y-axis is restricted. This assists in positioning the module 22.

A component 33 illustrated in FIG. 15 has an opening portion 33a shaped like an inverse angularly convex shape that is wider on the upper side than on the lower side. Further, a corresponding module 23 has grooves 23a provided between a projecting edge portion and a base end portion and extending in the X-direction.

More specifically, the module 23 includes a first base end portion 20c_1 and a second base end portion 20c_2 separated by a projecting edge portion 20b, and a third grooved portions 23a_1 having a first terminal end portion 23b_1 on an extension on the projecting edge portion 20b side of the first base end portion 20_c1. The module 23 also has a fourth grooved portion 23a_2 having a second terminal end portion 23b_2 on an extension on the projecting end portion side of the second base end portion 20c_2. The distance between the first terminal end portion 23b_1 and the second terminal end portion 23b_2 at the projecting edge portion 20b is smaller than the width of the lower side of the opening portion 33a shaped like an angularly convex hole.

For this reason, when the projecting end portion 22b of the module 23 is inserted in the opening portion 33a and the module 23 is properly positioned, the grooves 23a drop into the lower part of the opening portion 33a, whereby the module 23 is easily and reliably positioned in the Y-direction.

Figure 16:
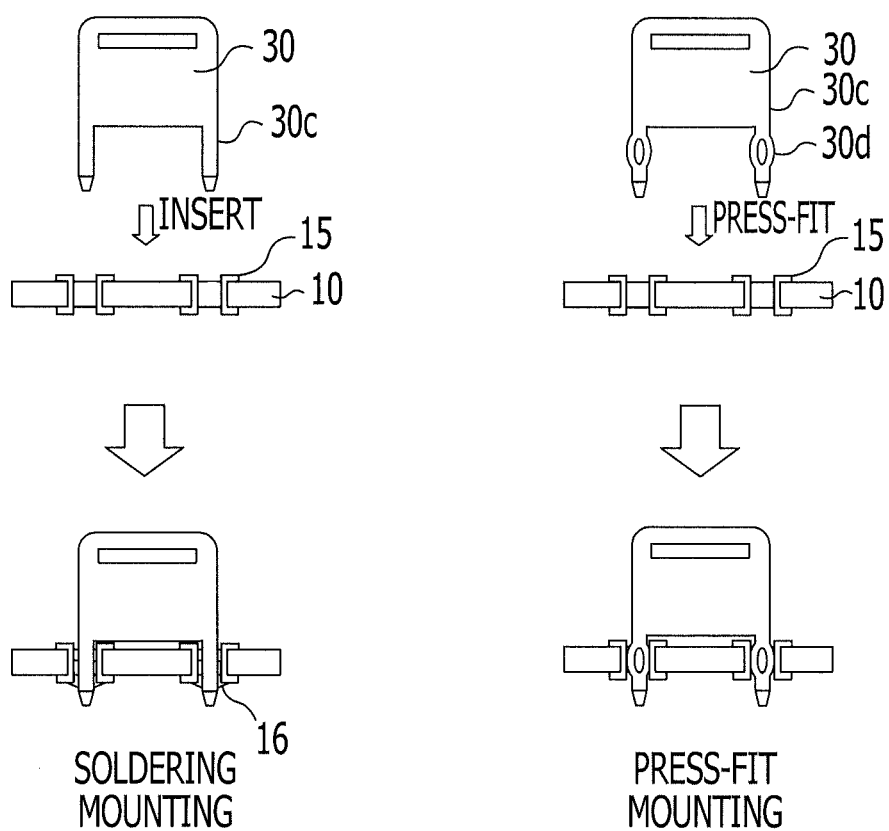
FIG. 16 illustrates lead portions of a component.

FIG. 16 illustrates the lead portions 30c of the component 30. As described above, the lead portions 30c serve to ensure the mounting position accuracy with respect to the motherboard 10. By the clearance and engagement structure between the lead holes 13 of the motherboard 10 and the lead portions 30c, the balance with the production cost can be adjusted in consideration of the production tolerance and required positioning accuracy.

Since the lead portions 30c contact the inner walls of the lead holes 13, the component 30 does not fall even when the component 30 is merely placed on the motherboard 10, and this enhances screwing operability. Since the component 30 is restrained in the XY-direction by the lead portions 30c and the lead holes 13, it can be secured with one screw, and the occupied area on the motherboard 10 can be reduced. Further, when the lead holes 13 are covered with plating 15 and the lead portions 30c are fixed by press-fit portions 30d or solder 16, the positioning screw can be omitted, and the mounting hole can be made small. The press-fit portions 30d are formed by thickening portions of the lead portions 30c that are in contact with the inner walls of the lead holes 13 in a standing position. By press-fitting the lead portions 30c with the press-fit portions 30d in the motherboard 10, the press-fit portions 30d are fixed by being pressed against the inner walls of the lead holes 13.

Since the lead portions 30c are thinner than the screw, the mounting and wiring areas can be made smaller than in the structure in which the component 30 is secured with a plurality of screws, and this allows mounting on a narrow area between the electronic components. Further, when the fixing screw is provided at a position such as to be hidden below the mounted module PCB, the operator is prevented from erroneously loosening the screw, for example, during maintenance of the motherboard 10. While the lead portions of the component 30 have been described as an example, this description also applies to the lead portions of the component 40.

Figure 17:
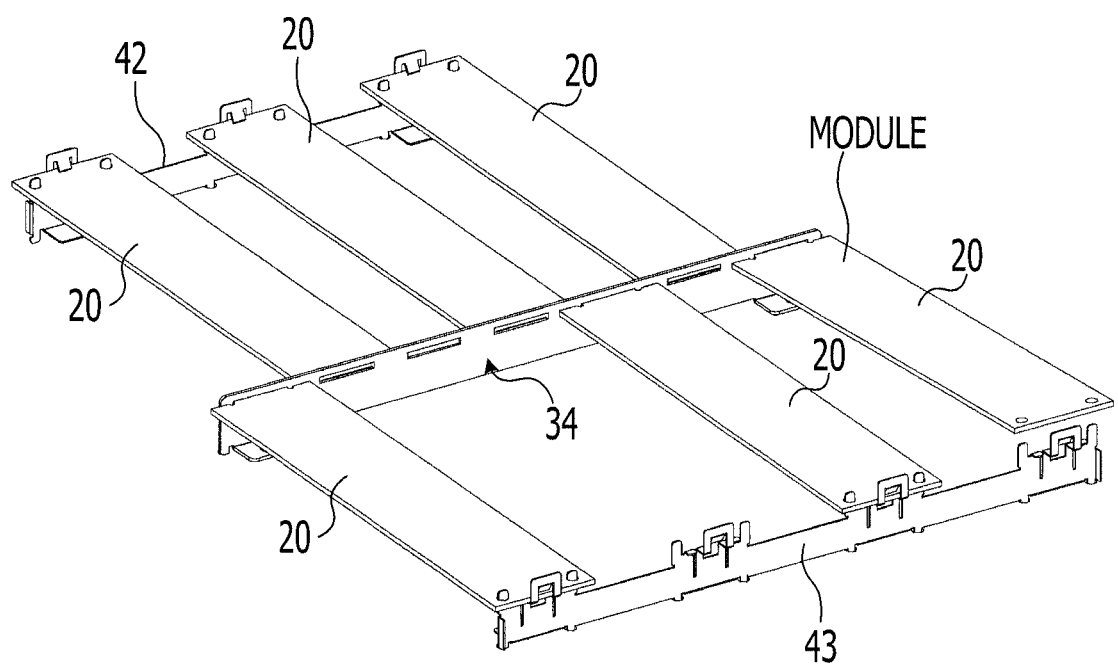
FIG. 17 illustrates a structure adopted when a plurality of modules are mounted.

FIG. 17 illustrates a structure in which a plurality of modules are mounted. In FIG. 17, a component 34 is shaped like a combination of seven components 30, a component 42 is shaped like a combination of three components 40, and a component 43 is shaped like a combination of four components 40.

Since the number of components is reduced by thus connecting a plurality of components 30 and 40, the occupied area on the motherboard can be reduced, and the influence on packaging density and wireability can be reduced. Moreover, it is possible to provide only the function and structure of the components 30, only the function and structure of the components 40, or the mixture of the components 30 and the components 40 in one component. This increases the flexibility in designing the mounting structure in relation to the type and layout of the modules.

In addition to positioning and fixing with the component 30 and the component 40, fixing with the distance tube adopted in the fourth comparative example may be performed. In this case, a screw hole serving as a third hole is provided in the PCB of the motherboard 10. In the PCB of the module 20, a fourth hole is provided at a position such as to oppose the screw hole serving as the third hole in a state in which the module 20 is mounted on the motherboard 10. The module 20 is fixed by fastening the PCB of the motherboard 10 and the PCB of the module 20 with a fastening member extending through the third hole and the fourth hole.

By thus combining the fall-out prevention structures, the module 20 is easily engaged with the motherboard 10, and the module 20 is more reliably prevented from falling off the motherboard 10. For this reason, the module 20 can be more reliably fixed even under disturbances such as vibration and shock.

Figure 18:
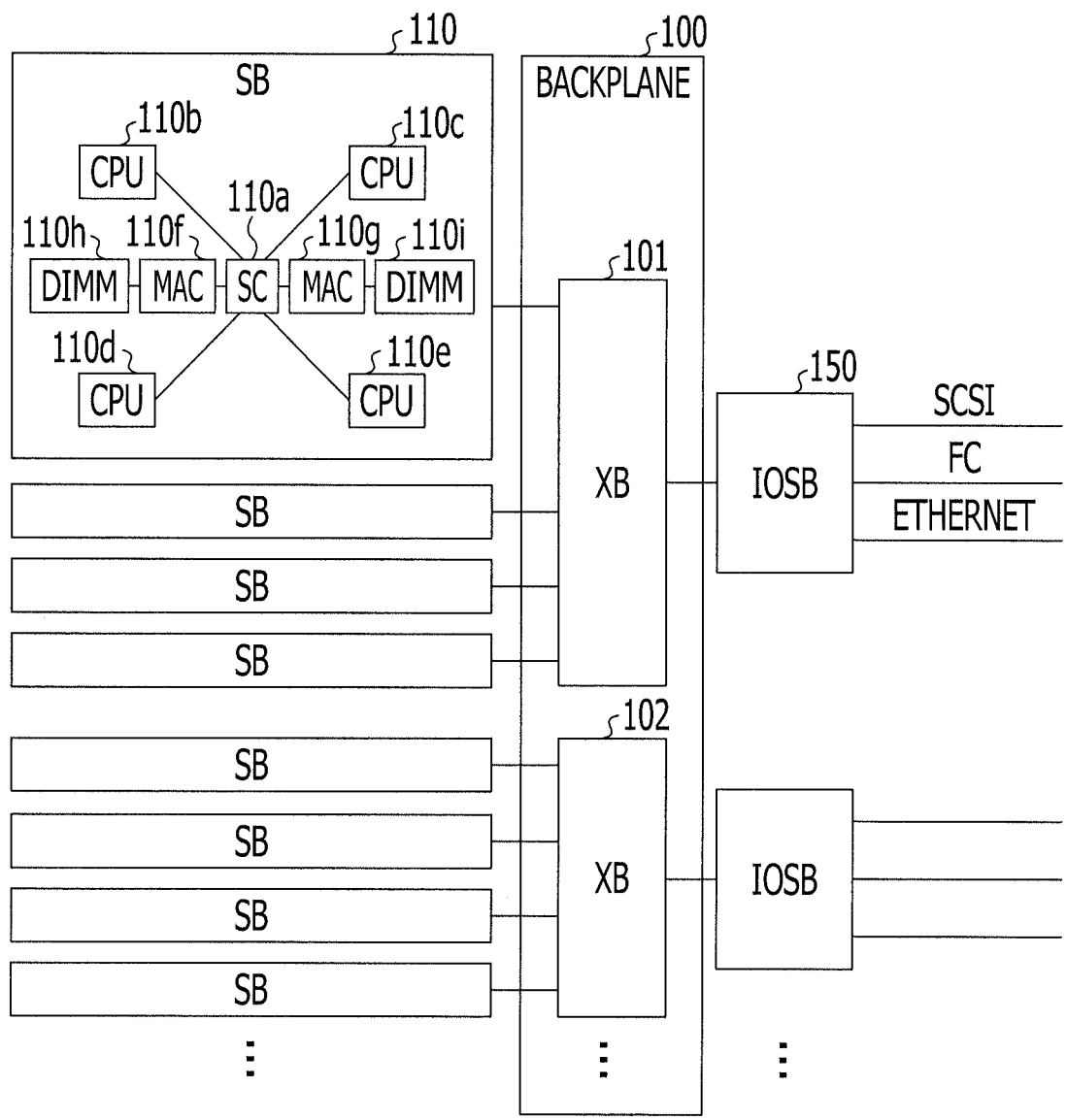
FIG. 18 illustrates a configuration of a server.

FIG. 18 illustrates an exemplary configuration of a server serving as an information processing apparatus corresponding to an electronic apparatus of an embodiment in which a module is added. As illustrated in FIG. 18, the server includes a plurality of crossbar switches XB101 and XB102 and so on in a backplane 100, and the crossbar switches respectively have system boards SB110 to SB113 and input/output system boards (IOSB). The numbers of the crossbar switches, system boards, and input/output system boards are just exemplary, and are not limited to those in the figure.

The backplane 100 is a circuit board that forms a bus for connecting a plurality of connectors. The crossbar switches XB101 and XB102 each dynamically select a path of data to be exchanged between the system board and the input/output system board.

The system boards SB110, SB111, SB112, and SB113 connected to the crossbar switches XB101 and XB102 are electronic circuit boards that constitute the electronic apparatus. Since the system boards SB110, SB111, SB112, and SB113 have similar configurations, only the system board SB110 will be described here. The system board SB110 includes a system controller (SC) 110a, four CPUs 110b to 110e, memory access controllers (MACs) 110f and 110g, and dual inline memory modules (DIMMs) 110h and 110i.

The SC 110a controls processing such as data transfer between the CPUS 110b to 110e and the MACs 110f and 110g, and also controls the entire SB 100. Each of the CPUS 110b to 110e is a processer to be connected to a different electronic apparatus via the SC 110a. The MAC 110f is connected between the SC 110a and the DIMM 110h, and controls the access to the DIMM 110h. The MAC 110g is connected between the SC 110a and the DIMM 110i, and controls the access to the DIMM 110i. The DIMM 110h is a memory module to be connected to a different electronic apparatus via the SC 110a to which a memory is added. The DIMM 110i is a memory module to be connected to a different electronic apparatus via the SC 110a to which a memory is added.

An IOSB 150 is connected to the system boards SB110 to SB113, and is also connected to an input/output device via a small computer system interface (SCSI), a fibre channel (FC), or Ethernet (registered trademark). The IOSB 150 controls processing such as data transfer between the input/output device and the crossbar switch XB101. The electronic devices mounted in the system board SB110, such as the CPUs, the MACs, and the DIMMs, are just exemplary, and the types or number of the electronic devices are not limited to those illustrated in the figure.

The system board SB110, the backplane 100, the crossbar switch XB101, or the IOSB 150 can be regarded as a motherboard 10, and the disclosed structure can be applied to add a module thereto. For example, when the system board SB110 is the motherboard 10, a module on which a nonvolatile memory is mounted can be added to and removed from the system board SB110. Alternatively, when the IOSB 150 is the motherboard 10, a communication module or an interface corresponding to a predetermined communication method can be added to and removed from the IOSB 150.

As described above, in an electronic apparatus of an embodiment, the projecting edge portion 20b is provided at one end of the module 20, and the opening portions 20e are provided at the other end thereof. Moreover, the component 30 having the opening portion 30a and the component 40 having the projecting portions 40a stand on the motherboard 10. By inserting the projecting edge portion 20b in the opening portion 30a of the component 30 and inserting the projecting portions 40a of the component 40 in the opening portions 20e, the stack connectors 11 and 12 are aligned with each other.

For this reason, according to an electronic apparatus of an embodiment, the connectors can be aligned easily and reliably. Further, even if an erroneous operation is performed during alignment, is the error does not have an influence on the connectors and the mounted components. Moreover, the lock portion 40b of the component 40 allows the module 20 to be attached and detached easily to/from the motherboard 10 and prevents the module 20 from falling out from the motherboard 10.

In the electronic apparatus of an embodiment, the occupied area on the PCB is narrow and the penetrating holes are small, and therefore, the influence on the packaging density and wireability on the PCB is small. In addition, even when a plurality of modules are mounted, the influence on the packaging density and wireability on the PCB is small. For this reason, the number of modules to be mounted can be increased without increasing the number of components.

A method of manufacture according to an embodiment includes forming a first connector on a first printed circuit board, providing a first member having a hole and a second member having a projecting portion to the first printed circuit board and forming a second connector on a second printed circuit board that connects with the first connector, where the first printed circuit board is connected with the second printed circuit board by engaging the hole and the projecting portion with corresponding portions of the second printed circuit board. The connector(s) enable the printed circuit boards to engage properly by connecting the respective printed circuit boards at predetermined positions of engagement.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An electronic apparatus, comprising:
a first printed circuit board on which a first connector is provided;
a first member that connects with the first printed circuit board and having a first hole;
a second member that connects with the first printed circuit board and having a projecting portion extending in a standing direction on the first printed circuit board; and
a second printed circuit board that includes a second connector, a first end portion that is inserted in the first hole, and a second end portion having a second hole, wherein the projecting portion of the second member is configured to penetrate the second hole when the first end portion remains inserted into the first hole thereby fixing a movement of the second printed circuit board relative to a direction of engagement of the first connector and the second connector.

2. The electronic apparatus according to claim 1, wherein the first end portion comprises:
a projecting edge portion that penetrates the first hole, and a base end portion that presses the first member, and
wherein the second member includes a latching portion that latches the second end portion together.

3. The electronic apparatus according to claim 2, the second member comprising:
a first grooved portion and a second grooved portion extending from a first side of the second member provided with the projecting portion, respectively; and
an elastic portion provided between the first grooved portion and the second grooved portion, the elastic portion pressing the second end portion, and
wherein the latching portion is provided in the elastic portion.

4. The electronic apparatus according to claim 3, wherein the projecting portion comprises:
a first projecting portion provided in a first section of the second member partitioned by the first side, the first grooved portion, and a second side of the second member opposing the first grooved portion; and
a second projecting portion provided in a second section of the second member partitioned by the first side, the second grooved portion, and a third side of the second member opposing the second grooved portion.

5. The electronic apparatus according to claim 3, wherein the second member comprises:
a first support portion provided in the elastic portion, the first support portion pushing up the second printed circuit board when the elastic portion deforms in a direction such that the latching portion unlatches the second end portion.

6. The electronic apparatus according to claim 1, wherein the first hole is chamfered on a side opposing the second printed circuit board, and
wherein the first end portion is chamfered on a surface opposing an inner wall of the first hole.

7. The electronic apparatus according to claim 1, wherein the first member comprising:
a first bent portion and a second bent portion provided to surround the first end portion, respectively; and
a second support portion provided at the first hole, the second support portion supporting the first end portion.

8. The electronic apparatus according to claim 2, wherein the first hole is an angularly convex hole having an upper side with a width larger than a width of the first end portion and a lower side with a width smaller than the width of the first end portion,
wherein the base end portion includes:
a first base end portion and a second base end portion separated by the projecting edge portion;
a third grooved portion having a first end portion on an extension on a side of the first base end portion close to the projecting edge portion; and
a fourth grooved portion having a second end portion on an extension on a side of the second base end portion close to the projecting edge portion,
wherein a distance between the first end portion and the second end portion at the projecting edge portion is smaller than the width of the lower side of the angularly convex hole.

9. The electronic apparatus according to claim 1, wherein the first printed circuit board comprises a third hole, wherein the second printed circuit board includes a fourth hole opposing the third hole in a state in which the second printed circuit board is connected to the first printed circuit board, and wherein the electronic apparatus includes a fastening member that extends through the third hole and the fourth hole so as to fasten the first printed circuit board and the second printed circuit board.

10. The electronic apparatus according to claim 1, wherein the first member comprises a first leg portion and a second leg portion, wherein the second member includes a third leg portion and a fourth leg portion, and wherein the first printed circuit board includes a first positioning hole in which the first leg portion is inserted, a second positioning hole in which the second leg portion is inserted, a third positioning hole in which the third leg portion is inserted, and a fourth positioning hole in which the fourth leg portion is inserted.

11. The electronic apparatus according to claim 10, wherein the first leg portion inserted in the first positioning hole, the second leg portion inserted in the second positioning hole, the third leg portion inserted in the third positioning hole, and the fourth leg portion inserted in the fourth positioning hole are soldered to the first printed circuit board.

12. The electronic apparatus according to claim 10, wherein the first leg portion, the second leg portion, the third leg portion and the fourth leg portion are respectively press-fitted in inner walls of the first, positioning hole, the second positioning hole, the third positioning hole and the fourth positioning hole.

13. A method of manufacture of an electronic apparatus, comprising:

forming a first connector on a first printed circuit board;

providing a first member having a hole and a second member having a projecting portion to the first printed circuit board; and forming a second connector on a second printed circuit board that connects with the first connector, and where the first printed circuit board is connected with the second printed circuit board by engaging the hole and the projecting portion with corresponding portions of the second printed circuit board and thereby fixes a movement of the second printed circuit board relative to a direction of engagement of the first connector and the second connector while the projection portion remains engaged.

* * * * *